United States Patent
Wang

(10) Patent No.: US 8,000,358 B2
(45) Date of Patent: Aug. 16, 2011

(54) POWER MONITORING SYSTEM FOR A PARALLEL OPTICAL TRANSMITTER

(75) Inventor: William H. Wang, Pleasanton, CA (US)

(73) Assignee: Emcore Corporation, Albuquerque, NM (US)

( * ) Notice: Subject to any disclaimer, the term of this patent is extended or adjusted under 35 U.S.C. 154(b) by 72 days.

(21) Appl. No.: 12/426,743

(22) Filed: Apr. 20, 2009

(65) Prior Publication Data

US 2010/0265974 A1    Oct. 21, 2010

(51) Int. Cl.
*H01S 3/13*    (2006.01)

(52) U.S. Cl. .................................................. 372/29.011

(58) Field of Classification Search ............ 372/29.011, 372/50.121, 50.12; 385/93, 48
See application file for complete search history.

(56) References Cited

U.S. PATENT DOCUMENTS

| | | | |
|---|---|---|---|
| 5,757,836 A | 5/1998 | Jiang et al. | |
| 5,774,486 A | 6/1998 | Jiang et al. | |
| 5,997,185 A * | 12/1999 | Kropp | 385/89 |
| 6,026,102 A * | 2/2000 | Shimoji | 372/22 |
| 6,314,223 B1 | 11/2001 | Te Kolste et al. | |
| 6,526,076 B2 * | 2/2003 | Cham et al. | 372/29.011 |
| 6,591,043 B2 | 7/2003 | Te Kolste et al. | |
| 6,921,214 B2 * | 7/2005 | Wilson | 385/89 |

* cited by examiner

*Primary Examiner* — Jessica Stultz
*Assistant Examiner* — Tuan Nguyen

(57) ABSTRACT

A power monitoring system uses a low loss reflective element to partially split the output laser beams from an array of laser sources, in a parallel configuration, to produce a monitor beams for each laser source. Each of these monitor beams may propagate within the reflective element in a lossless manner under total internal reflection and into one of a plurality of photodiodes that sense an optical characteristic such as output beam intensity, where this sensed signal is then used as part of a feedback control to control operation of the laser sources in the array.

21 Claims, 3 Drawing Sheets

POWER MONITORING SYSTEM FOR A PARALLEL OPTICAL TRANSMITTER

BACKGROUND OF THE DISCLOSURE

1. Field of the Disclosure

The disclosure relates generally to power monitoring techniques for optical transmitters and, more particularly, to power monitoring systems used in feedback control of parallel optical transmitters.

2. Brief Description of Related Technology

Communication systems are called upon to transmit large volumes of data between users. Increasingly, these communication systems transmit such data through techniques that allow for simultaneous communication between users. In wireless communication systems, for example, simultaneous (or near simultaneous) communication can be achieved through channelizing data before broadcast—in essence segmenting an allotted bandwidth spectrum into different channel frequencies each assigned to different users for data communication. In optical communication systems, where optical fibers form at least part of the data transmission path, various techniques have been developed for simultaneous communication. Multimode fibers capable of simultaneously sustaining multiple light beams have been employed for short distance data communications. Such devices have been implemented using arrayed waveguide grating switches, for example. Increasingly, however, system designers have turned to parallel optical transmitters for more robust applications, over longer distances and when there is a premium on avoiding crosstalk and other errors.

Parallel optical transmitters typically rely upon a bank (or array) of lasers each capable of communicating individually through a bank (or array) of dedicated optical fibers. Recently, designers have turned to less complex architectures that avoid active or passive optical switching techniques common in the area. Instead dedicated, pre-assigned optical pairings between laser source and optical fiber are used. Often these parallel optical transmitters use a vertical cavity surface emitting laser (VCSEL) as the laser source.

In traditional systems, VCSEL lasers require constant or near constant monitoring of power levels, and in some cases in the monitoring of output channel wavelength. VCSELs, as well as other laser sources, are susceptible to degradation of performance over time (e.g., a reduction in output power). VCSELs can be susceptible to environmental conditions, such as temperature, which can alter the output power levels. While VCSELs are often batch fabricated, there can be fluctuations in the output power levels across the different VCSELs within the same parallel array device. In these instances, the same optical transmitter could have some data channels that transmit at higher, native power levels than other data channels.

Power monitoring thus is integral to ensuring acceptable operation of VCSEL-based transmitters. Typical power monitoring control is performed by measuring an output of a light emitting device and using this measurement to control the power supplied to the light emitting device. While some laser sources can be designed to emit a monitoring beam separately from the main data beam, because VCSELs typically only emit light from one surface, any monitoring must be from the same output beam used for data communications.

VCSELs are much cheaper and their surface emissions make them easier to integrate with other optical devices than the edge emitting lasers, so the use of VCSELs is very desirable.

Current attempts to monitor the power of VCSELS involve splitting off a portion of the output beam and, in some examples, applying that portion to a diffractive optical element which then splits the beam into two portions. These techniques are transmission-based in design—light must pass through the diffractive element to be split—and thus are useful in setting up power monitoring at both the laser transmitter side as well as at the fiber coupling side. The techniques, as well as other power monitoring techniques can be costly and overly difficult to manufacture. In the case of diffractive elements, these have to be imprinted, written, or otherwise formed on a substrate. Proper alignment is manufacturing intensive, and a different element must be used for each laser source. Other attempts at creating a monitor beam include physically forming a y-branch inside the main transmission substrate. These configurations, as with diffractive optical elements, require exact alignment to affect acceptable operation. Also, in either case, the close proximity desired between laser sources produces space constraints which also limit the effectiveness of conventional techniques.

The inventor has found there is a need for techniques that allow laser sources within a parallel optical transmitter to be monitored simultaneously to ensure proper device operation.

SUMMARY OF THE DISCLOSURE

In accordance with one aspect of the disclosure, an optical power monitoring system for a laser array comprises a parallel channel laser array having a plurality of laser sources, each capable of producing a respective light beam; a lens apparatus having an entrance surface facing the parallel channel laser array and an exit surface opposite the entrance surface; a reflector element having a side edge that is positioned to simultaneously collect a portion of each of the light beams from the plurality of laser sources and split the light beams into (a) a plurality of respective monitor beams each to propagate within the reflector element and (b) a plurality of output beams to propagate within the lens apparatus, where the lens apparatus is configured to receive the output beams at the entrance surface and couple each of the output beams into one of a plurality exit fibers, wherein the reflector element is configured to propagate each of the monitor beams under total internal reflection from an entrance region at the side edge to an exit region of the reflector element; and an array of detectors aligned with the exit region to receive the monitor beams from the plurality of laser sources and to sense an optical characteristic for each of the monitor beams, where each detector of said array is dedicated to one of the laser sources.

In accordance with another aspect of the disclosure, an optical system comprises a light source producing a light beam; a lens apparatus having an entrance surface facing the light source and an exit surface opposite the entrance surface; a reflector element having a side edge that is positioned within the light beam to split the light beam into a monitor beam to propagate within the reflector element and an output beam to propagate within the lens apparatus, where the lens apparatus is configured to receive the output beam at the entrance surface and couple the output beam into an exit fiber facing the exit surface, wherein the reflector element is to propagate the monitor beam under total internal reflection from an entrance region at the side edge to an exit region of the reflector element; and a detector aligned with the exit region to receive the monitor beam and sense an optical characteristic of the monitor beam.

In accordance with another aspect of the disclosure, an optical system comprises a parallel channel laser array having a plurality of laser sources, each capable of producing a respective light beam; a reflector element having an entrance surface facing the parallel channel laser array and having an exit surface opposite the entrance surface, wherein the reflector element is configured to receive the light beams at the entrance face and wherein the reflector element includes a side edge that splits the light beams into (A) a plurality of respective monitor beams that impinge upon a first reflective surface and (B) a plurality of respective output beams that are coupled into one of a plurality of coupling lenses at the exit surface, wherein the side edge splits between the plurality of coupling lenses and the first reflective surface, wherein the first reflective surface reflects the plurality of monitor beams under total internal reflection to at least one other reflective surface for coupling the monitor beams back to the entrance surface of the reflector element at an exit region; and an array of detectors aligned with the exit region to receive the monitor beams and sense an optical characteristic of the monitor beams.

BRIEF DESCRIPTION OF THE DRAWING FIGURES

For a more complete understanding of the disclosure, reference should be made to the following detailed description and accompanying drawing figures, in which like reference numerals identify like elements in the figures, and in which.

Figure 1:
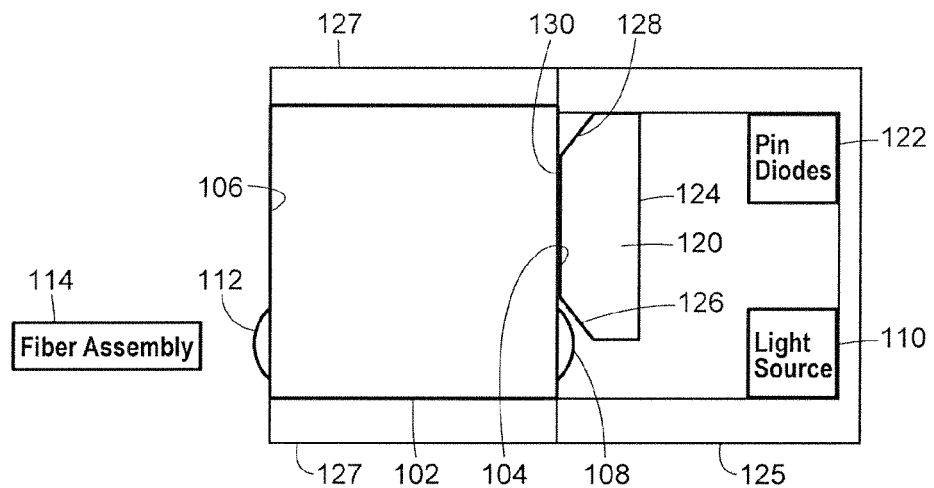
FIG. 1 is a side view of an parallel channel optical transmitter having a power monitoring subsystem in accordance with an example herein.

While the disclosed methods and apparatus are susceptible of embodiments in various forms, there are illustrated in the drawing (and will hereafter be described) specific embodiments of the invention, with the understanding that the disclosure is intended to be illustrative, and is not intended to limit the invention to the specific embodiments described and illustrated herein.

DETAILED DESCRIPTION OF PREFERRED EMBODIMENTS

FIG. 1 illustrates an example configuration of a power monitoring system 100 that may be used as part of a feedback control of an energy source. More specifically, the illustrated example is configured to collect a portion of an output beam from that energy source (e.g., a portion of a laser beam or stimulated emission) and measure an optical characteristic of that beam portion. This measurement may then be used in a feedback manner to control operation of the energy source, for example, to control output power of the energy source when the optical characteristic is power or the output energy wavelength when the optical characteristic is wavelength or channel frequency. In contrast to some traditional power monitoring configurations, the system 100 is designed to offer a less complex configuration that relies upon a lossless propagation mechanism such as total internal reflection to collect a monitor beam portion and couple that portion to a diode laser or other sensor. By using, in the illustrated example, a single reflector mechanism configured relative to the laser source, the system 100 is able to controllably monitor the laser beam from an array of energy sources, coupling each of those portions, by using one lossless reflector that simultaneously collects monitor beams for an array of laser sources. Those monitor beams may then be simultaneously coupled to sensors that measure the optical characteristics of interest.

The system 100 contains a lens array assembly 102 that has an entrance surface 104 and exit surface 106 opposite one another and each corresponding to an energy source and an output waveguide, respectively. For the illustrated example, the assembly 102 optionally includes an array of coupling lenses 108 that each correspond to one of an array of lasers 110. The lasers 110 in the illustrated example are VCSELs, which are commonly used in parallel channel optical transmitters for their ease of assembly and packing. The lasers 110 in fact can be replaced with any light emitting device capable of converting an electrical signal into an optical signal, such as an edge-emitting laser diode, a VCSEL, a light emitting diode (LED), Fabry Perot lasers, gas-based lasers, and the like.

Figure 2:
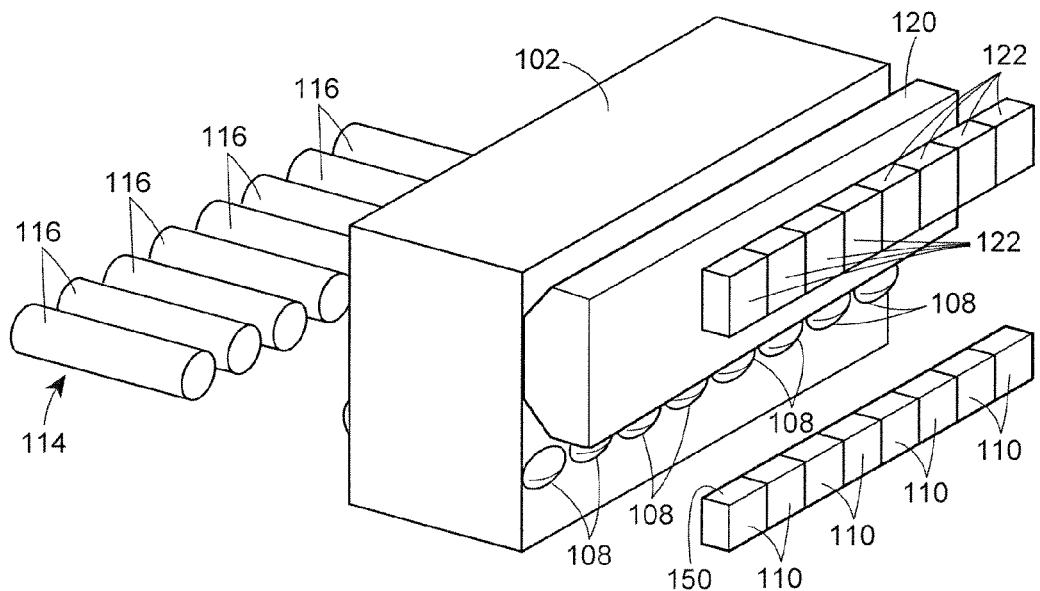
FIG. 2 is a exploded perspective view of a portion of the structures in the example of FIG. 1.

While eight VCSELs 110 are shown, the array is not limited to a particular number of lasers and may include more or fewer lasers, in either a linear array (as shown in FIG. 2) or a two-dimensional array. The VCSELs 110 may be spaced from the lenses 108 to collect laser energy and couple it for propagation in the lens assembly 102 in a collimated or non-collimated manner.

The exit surface 106 includes an array of coupling lenses 112 that couple the laser beams from the array of VCSELs 110 into a fiber assembly 114, which in the illustrated example of FIG. 2 is a fiber ribbon, or fiber array. Standard fiber ribbons meeting any of the industry standards, such as Telcordia or IEC standards may be used. Further, fiber ribbons of any dimension 4, 6, 8, 12, 24, 36 or otherwise may be used depending on the size of the array of VCSEL elements forming the parallel optical transmitter. In the illustrated example, the fiber ribbon 114 contains 8 single mode fibers 116 each one receiving an output beam from one of the VCSELs 110 through one pair of the coupling lenses 108 and 112.

The device 100 may be packaged in an optical module (not shown) including an integrated or detachable electrical connector providing lead lines or wires to connect with the VCSELs 110 and photodiodes 122, e.g., through a circuit board (not shown). The device 100 may be housed within a housing surrounding or capping a platform supporting the structures as shown.

A lossless, total internal reflection element 120 is positioned within the system 100 to collect a portion of the output beams from the VCSELs 110 and couple that portion to a feedback control system. More specifically, in the illustrated example, a right angle prism 120 is positioned to collect a portion of the output beam from the VCSELs 110 and couple that portion to an array of photodiodes 122. The photodiodes 122 represent any sensor capable of converting an optical (i.e., photonic) signal to an electrical signal, including PIN photodiodes or avalanche photodiodes. The prism 120 includes an entrance face 124 that, in some examples, may be coated with an antireflection material or angled to reduce reflection loss of the incident output beam. A first right angle reflector surface 126 is configured to reflect the portion of the output beam under total internal reflection to a second right angle reflector surface 128 aligned to couple that portion to a corresponding one of the photodiodes 122. By using a prism with two surfaces aligned to operate under total internal reflection, optical losses in the monitoring system are minimized. This means that a smaller portion of the VCSEL output beam can be collected by the element 120 in the first instance. For example, the prism 120 may be positioned to collect as little of 1 to 2% of the output beam and reflect that amount to the photodiodes 122. The prism 120 may be positioned to collect much more of the output beam, ranging from 1 to 2% to up to 50% or more. The sensitivity of the sensing mechanism as well as the desired power of the output beam may determine the amount of power taken to form the monitoring beam portion.

An advantage of a prism reflector is that, unlike a diffractive optical element which must be fabricated to light-source dependent dimensions, the prism 120 is relatively wavelength independent. The prism 120 may be used consistently across any desired optical communications wavelength, including for example, wavelengths in the ultraviolet, visible, near infrared, and far infrared spectral regions.

The prism 120 is positioned to overlap with the light beam the VCSEL 110 where the amount of overlap determines the amount of the light beam that is colleted as the monitoring beam versus the amount that passes at the output beam. In some examples, the prism 120, the VCSELs 110, and the photodiodes 122 may formed as part of sub-assembly having a support structure 125 or frame that keeps these structures aligned with one another and separately allows the assembly to be mounted to the lens array 102 and/or to a lens holder 127. Either the lens array assembly 102 alone or the assembly with the lens holder 127 and/or other attendant structures for mounting may be considered as forming the lens apparatus. Because alignment between the VCSELs 110 and the prism 120 will likely involve tight tolerances, to prevent excessive amounts of the output beam from being coupled to the monitoring photodiodes, while alignment on the lens array 102 may be more forgiving, using a sub-assembly can allow for greater ease of overall device assembly while ensuring consistency in the amount of the output beam that is coupled to the monitoring photodiodes. The support structure can offer the added benefit of being mounted in different locations to achieve different power ratios between the monitor beam and the output beam. In some examples, the support structure could be adjustable during operation, for example, by being part of a translatable stage to allow adjustment of the position of the prism 120 and other portions of the monitoring side relative to the lens assembly 102, to thereby control power ratios between the monitor beam and the output beam.

The support structure 125 may be mounted directly with lens assembly 102 and in such a manner that the prism 120 has a mounting face 130 mounted directly against the entrance face 104, as shown. Alternatively, the prism 120 may be positioned out of direct contact with the entrance face 104, for example, with the prism 120 suspended out of contact with the lens assembly 102 by the support structure 125. Because, in the illustrated example of the prism 120 none of the incident beam portion impinges on the mounting face 130, whether the prism 120 is mount directly to the lens assembly 102 will not affect optical characteristics of the device. However, for other prism 120 configurations, for example a tighter right angle reflector, it may be desirable to coat the back surface of the prism 120 that is to be mounted directly to the lens assembly 102 with an antireflection/signal loss coupling element to avoid optical losses at the interface boundary. It is also noted that the right angle reflector surfaces 126 and 128 may each be coated with an anti-reflection coating which may be useful in further reducing coupling losses, especially when the monitor beam collected in the prism 120 has a wide spread angle due to diffraction from the VCSEL 110 surface. Thus, these surfaces 126, 128 may be coated with an antireflective coating to better ensure lossless reflection through the prism 120, for example, in the event the light incident on the surfaces is not incident at an angle for inducing total internal reflection. In such examples, the monitor beam will maintain its dispersion as it propagates through the prism 120. Numerous other modifications to the prism 120 and other structural elements may be made. For example, either or both of the right angle reflector surfaces 126, 128 can be curved to focus and/or collimate the incoming output beam portion.

FIG. 2 illustrates a partial exploded view of various structures in the example FIG. 1. Each individual light source 110 combines with the other light sources to form a parallel channel laser array 150. The array 150 may be formed of different lasers mounted to a single substrate. In some other examples, all the light sources 110 may be fabricated from on the same substrate from a semiconductor processing technique. The latter may be particularly useful when the light sources 110 are a plurality of laser sources, such as VCSELs. As illustrated, the prism 120 collects multiple laser beams from these sources 110 and splits them to multiple monitor beams and multiple output beams, the former for coupling to one of a plurality of diodes 122, the latter for propagation through the lens assembly 102 to the fiber assembly 114, and more specifically individual fibers 116 within that structure. The prism 120 thus is a reflector element having a side edge positioned to simultaneously collect a portion of all light beams in a parallel channel laser device.

Figure 3:
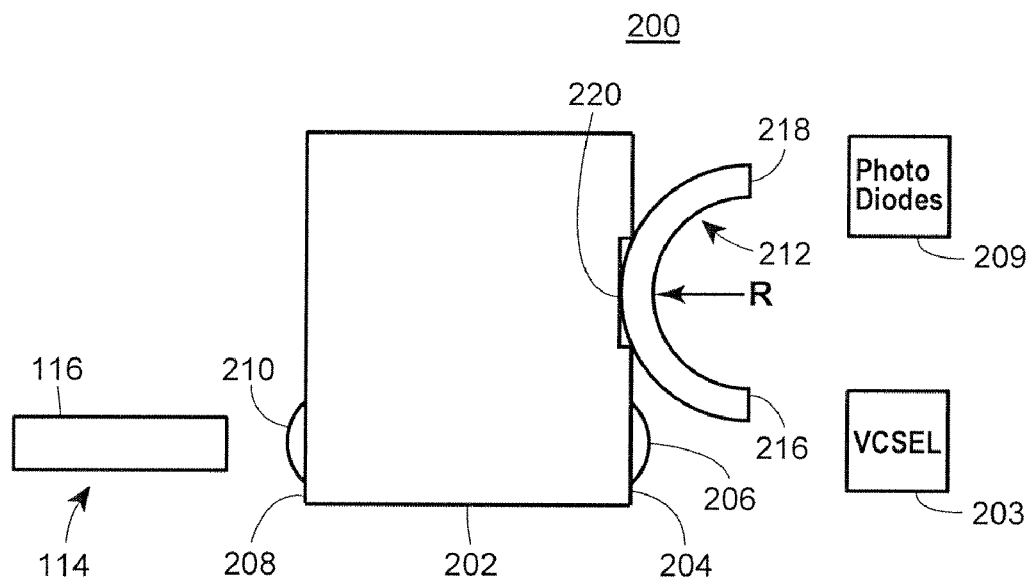
FIG. 3 is a cross-sectional view of a parallel channel optical transmitter having a power monitoring subsystem in accordance with another example herein.

FIG. 3 is similar to FIG. 1 and illustrates a power monitoring system 200 having a lens array assembly 202 coupling output beams from the array of VCSELs 203 into the fiber ribbon array 114. The lens assembly 202 includes an entrance face 204 having a first set of coupling lenses 206, and an exit face 208 having a second set of coupling lenses 210, where each coupling lens pair couples one of the VCSELs 110 to one of the single mode of the fiber ribbon array 114.

Figure 4:
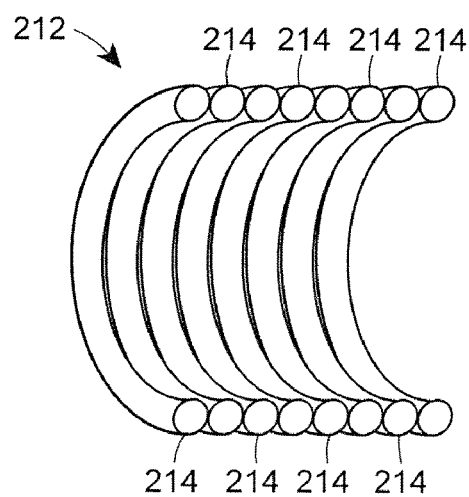
FIG. 4 is a perspective view of an optical fiber assembly forming a reflective element used in the power monitoring system of FIG. 3.

In place of a prism as the lossless reflector element, the system 200 includes a fiber array 212 positioned to collect a portion of the output beam from each of the VCSELs 203 and direct that portion to the array of photodiode 209. The fiber array 212 includes bundle of individual fibers 214 (see, FIG. 4) one for each of the VCSELs 110. The fibers are configured to have a bend radius, R, over a substantial portion of their length. The bend radius is chosen to maintain lossless or substantially total internal reflection propagation of the monitor beams propagating through the fibers 214. Each fiber 214 may be further designed to include an embedded gradient index lens for focusing the beam portions into and/or out of the fibers 214. That is, a first end 216 and/or a second end 218 of each fiber 214 may include an embedded gradient index lens. Alternatively, no lens may be used or an end-cap lens may be formed or fused to the end faces of the fibers 214.

While in some examples, such as those discussed above with respect to FIG. 1, a support assembly may be used to mount the monitoring sub-system to the lens array, in the illustrated example of FIG. 3, the fiber array 212 is mounted directly to the lens array assembly 202. For example, the fiber array 212 is mounted in a recess 220 extending from the surface 204 of the assembly 202. That recess 220 may be positioned to align the array 212 for proper coupling between the VCSELs 110 and the photodiodes 122 and to align the fibers 214 to split the incoming light beams from the VCSELs 203 into the monitor beam and output beam in the desired output power ratios. As with the examples above, the photodiodes 209 measure optical power for each VCSELs monitor beam. The detected signal may then be coupled to a laser controller within the parallel channel laser device for individually controlling the output power levels of the corresponding VCSEL. This would be a power monitoring and laser feedback adjustment control. In other examples, these photodiodes 209 may be replaced with other sensors sensing other optical characteristics such as center wavelength. Such sensors can be used as part of a feedback control in which the controller tunes the center wavelength (or output channel wavelength) of the laser sources to ensure channel wavelength isolation.

Figure 5:
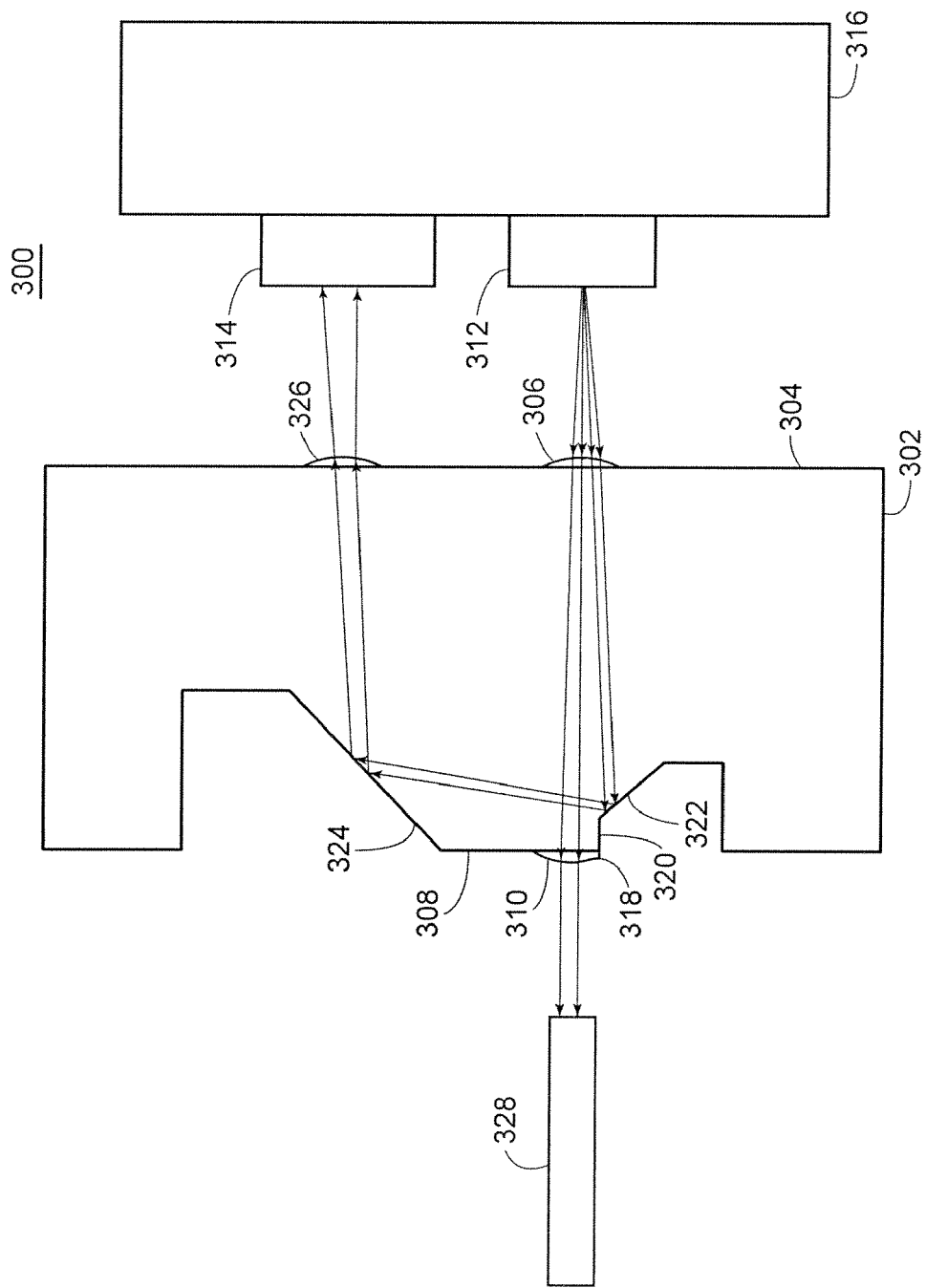
FIG. 5 is a cross-sectional view of a parallel channel optical transmitter having a power monitoring subsystem in accordance with another example herein.

FIG. 5 illustrates another example power monitoring system 300 which has an integrated lens array assembly and lossless, total internal reflection element 302. The element 302 includes a front face 304 onto which a first array of coupling lenses 306 are disposed, as well as a rear face 308 onto which a second array of coupling lenses 310 are disposed. A VCSEL array 312 and a PIN photodiode array 314 are mounted to a support plate or base 316 and aligned in relation to the lens arrays assembly 302 such that light from each of the VCSELs 312 passes through one of the lenses 306. The lenses 306 are convex dispersing lenses each paired with a corresponding one of the lenses 310 to facilitate splitting of the VCSEL light beams into an output beam that passes through the corresponding lens 310 and a monitoring beam that is coupled back to the PIN array 314 using an embedded lossless internal reflection element.

More specifically, in the illustrated example, beam splitting is achieved by using a partially formed convex element as the lens 310. In the illustrated example, each lens 310 has been sheared to form a slice face 318 that is aligned with a slice face 320 formed into the lens array assembly 302. The slice faces 318 and 320 form a beam splitter that splits the VCSEL light beam into the output beam that passes through the partially sliced lenses 310 and a monitoring beam that is reflected off a first reflector surface 322, which also forms part of the beam splitter. In this case, the reflector surface 322 is a facet formed in the element 302, preferably at an angle at or above a Brewsters angle (like surfaces 126 and 128) to the VCSEL light beam to reflect the monitor portion of that beam under total internal reflection. In another embodiment (not shown), the lenses 310 could be simply shifted away from the slice faces 318 and 320 to avoid being sliced and preserve their fullness for ease of forming the lenses. The surface 322 (indeed the entire element 302 with the surfaces as shown) may be formed through injection molding of the entire element 302, for example, using glass or silicon based materials, or materials such as polyetherimide (PEI) an amorphous, amber-to-transparent thermoplastic also known at ULTEM. Any suitable optical material capable of propagating the light beams with minimal absorption may be used. In other examples, the surface 322 may result from diamond cutting or laser cutting of the substrate 302. In either case, the surface 322 may be coated with a reflective material to further ensure lossless reflection of the monitor beam.

To couple the monitor beam to the photodiodes 314, the surface 322 is aligned with a second reflector surface 324. Alignment between surfaces 322 and 324 is affected by ensuring that the monitor beam is reflected off of both surfaces in a manner that internal reflection is achieved, either through total internal reflection achieved through Brewsters angle orientation or through reflective coatings. The second surface 324 is aligned with the third array of lens 326. The lenses 326 are aligned with the lenses 306 in a one on one manner. In this way, each lens 306, the surface 322, the surface 324, and each lens 326 are aligned to couple light from one VCSEL 312 to one PIN photodiode 314. By using total internal reflection off of the back surface of the integrated reflector element 302, the overall cost of using a separate lens array and reflector element may be reduced, as well as the manufacturing time. Plus, alignment is inherently built into the device for less room for assembly error.

While the present invention has been described with reference to specific examples, which are intended to be illustrative only and not to be limiting of the invention, it will be apparent to those of ordinary skill in the art that changes, additions and/or deletions may be made to the disclosed embodiments without departing from the spirit and scope of the invention.

The foregoing description is given for clearness of understanding only, and no unnecessary limitations should be understood therefrom, as modifications within the scope of the invention may be apparent to those having ordinary skill in the art.

What is claimed is:

1. An optical power monitoring system for a laser array, the system comprising:
   a parallel channel laser having a plurality of laser sources, each capable of producing a respective light beam;
   a lens apparatus having an entrance surface facing the parallel channel laser array and an exit surface opposite the entrance surface;
   a reflector element positioned between the parallel channel laser and the lens apparatus, the reflector element having a side edge that is positioned to overlap a portion of each of the light beams to simultaneously collect a portion of each of the light beams from the plurality of laser sources and split the light beams into (a) a plurality of respective monitor beams each to propagate within the reflector element and (b) a plurality of output beams to propagate within the lens apparatus, where the amount of overlap determines the amount of the light beams collected as monitoring beams and the amount of the light beams that pass as the plurality of output beams and where the lens apparatus is configured to receive the output beams at the entrance surface and couple each of the output beams into one of a plurality exit fibers, wherein the reflector element is configured to propagate each of the monitor beams under total internal reflection from an entrance region at the side edge to an exit region of the reflector element;
   an array of detectors aligned with the exit region to receive the monitor beams from the plurality of laser sources and to sense an optical characteristic for each of the monitor beams, where each detector of said array is dedicated to one of the laser sources; and
   wherein the reflector element comprises a prism having a first reflective surface aligned to receive the monitor beams and a second reflective surface aligned with the first reflective surface to couple the monitor beams to the array of detectors.

2. The optical power monitoring system of claim 1, wherein the first reflective surface and the second reflective surface are each coated with a reflective.

3. The optical power monitoring system of claim 1, wherein the reflector element, the array of detections and the parallel channel laser array are mounted to a support structure that maintains alignment between the array of detectors and the plurality of laser sources with the reflector element, and wherein that support structure is directly mountable to the lens apparatus.

4. The optical power monitoring system of claim 3, wherein the support structure is directly mounted to the lens apparatus to couple each output beam through a different coupling lens at the entrance surface of the lens apparatus.

5. The optical power monitoring system of claim 1, wherein the reflective element comprises a plurality of optical fibers each having a bend radius, R, and each optical fiber aligned to couple one of the monitor beams from one of the plurality of laser sources to one of the array of detectors under total internal reflection.

6. The optical power monitoring system of claim 5, wherein the plurality of optical fibers are mounted directly to a recess in the lens assembly.

7. The optical power monitoring system of claim 1, wherein the electrical characteristic is wavelength of the light beam or power of the light beam.

8. The optical power monitoring system of claim 1, wherein each laser source is a vertical cavity surface emitting laser (VCSEL).

9. An optical system comprising:
a light source producing a light beam;
a lens apparatus having an entrance surface facing the light source and an exit surface opposite the entrance surface;
a reflector element positioned between the light source and the lens apparatus, the reflector element having a side edge that is positioned to overlap a portion of the light beam to split the light beam into a monitor beam to propagate within the reflector element and an output beam to propagate within the lens apparatus, where the amount of overlap determines the amount of the light beam that is collected as the monitor beam and the amount of the light beam that passes as the output beam and where the lens apparatus is configured to receive the output beam at the entrance surface and couple the output beam into an exit fiber facing the exit surface, wherein the reflector element is to propagate the monitor beam under total internal reflection from an entrance region at the side edge to an exit region of the reflector element;
a detector aligned with the exit region to receive the monitor beam and sense an optical characteristic of the monitor beam;
wherein the reflector element comprises a prism having a first reflective surface aligned to receive the monitor beam and a second reflective surface aligned with the first reflective surface to couple the monitor beam to the detector; and
wherein the reflector element, the detector and the light source are mounted to a support structure that maintains alignment between the detector and the light source with the reflector element.

10. The optical system of claim 9, where the first reflective surface and the second reflective surface are each coated with a reflective coating.

11. The optical system of claim 9, wherein the support structure is directly mounted to the lens apparatus to couple the output beam through a coupling lens at the entrance surface of the lens apparatus.

12. The optical system of claim 9, wherein the reflective element is an optical fiber having a bend radius, R, and having a first fiber end at the entrance region and positioned to split the light beam to form the monitor beam, and wherein the reflect element has a second fiber end at the exit region that is positioned to couple the monitor beam into the detector.

13. The optical system of claim 12, wherein the optical fiber is mounted directly to an alignment recess in the lens assembly.

14. The optical system of claim 9, wherein the electrical characteristic is wavelength of the light beam or power of the light beam.

15. The optical system of claim 9, wherein the light source is a vertical cavity surface emitting laser (VCSEL).

16. An optical system comprising:
a parallel channel laser array having a plurality of laser sources, each capable of producing a respective light beam;
a reflector element positioned between the parallel channel laser array and a lens apparatus, the reflector element having an entrance surface facing the parallel channel laser array and having an exit surface opposite the entrance surface facing the lens apparatus, wherein the reflector element is configured to receive a portion of the light beams at the entrance face and wherein the reflector element includes a side edge that is positioned to overlap a portion of each of the light beams and that splits the light beams into (A) a plurality of respective monitor beams that impinge upon a first reflective surface and (B) a plurality of respective output beams that are coupled into one plurality of coupling lenses at the exit surface, wherein the amount of overlap determines the amount of the light beam that is collected as the monitor beams and the amount of the light beams that passes as the output beam, wherein the side edge splits between the plurality of coupling lenses and the first reflective surface, wherein the first reflective surface reflects the plurality of monitor beams total internal reflection to at least one other reflective surface for coupling the monitor beams back to the entrance surface of the reflector element at an exit region;
an array of detectors aligned with the exit region to receive the monitor beams and sense an optical characteristic of the monitor beams; and
wherein the reflector element comprises a prism having a first reflective surface aligned to receive the monitor beams and a second reflective surface aligned with the first reflective surface to couple the monitor beams to the array of detectors.

17. The optical system of claim 16, wherein the first reflective surface, the side edge, and the plurality of coupling lenses are disposed at the exit surface of the reflector element.

18. The optical system of claim 16, wherein the first reflective surface is formed as a first rear facet of the reflector element and wherein the at least one other reflective surface is formed as a second rear facet of the reflector element, where the first reflective surface and the at least one other reflective surface are aligned to achieved total internal reflection propagation of the other monitor beams.

19. The optical system of claim 16, wherein the reflector element further comprises a second plurality of coupling lenses positioned at the entrance face and each positioned to collect a light beam from one of the plurality of laser sources.

20. The optical system of claim 19, wherein the reflector element further comprises a third plurality of coupling lenses each positioned to couple one of the monitor beams to one of the detectors in the array of detectors.

21. An optical power monitoring system for a laser array, the system comprising:
a parallel channel laser having a plurality of laser sources, each capable of producing a respective light beam;
a lens apparatus having an entrance surface facing the parallel channel laser array and an exit surface opposite the entrance surface;
a reflector element positioned between the parallel channel laser and the lens apparatus, the reflector element having a side edge that is positioned to overlap a portion of each of the light beams to simultaneously collect a portion of each of the light beams from the plurality of laser sources and split the light beams into (a) a plurality of respective monitor beams each to propagate within the reflector element and (b) a plurality of output beams to propagate within the lens apparatus, where the amount of overlap determines the amount of the light beams that is collected as monitoring beams and the amount of the light beams that passes as the plurality of output beams and where the lens apparatus is configured to receive the output beams at the entrance surface and couple each of the output beams into one of a plurality exit fibers, wherein the reflector element is configured to propagate each of the monitor beams under total internal reflection from an entrance region at the side edge to an exit region of the reflector element; and an array of detectors aligned with the exit region to receive the monitor beams from the plurality of laser sources and to sense an optical characteristic for each of the monitor beams, where each detector of said array is dedicated to one of the laser sources;

wherein the reflector element comprises a prism having a first reflective surface aligned to receive the monitor beams and a second reflective surface aligned with the first reflective surface to couple the monitor beams to the array of detectors; and wherein the reflector element, the array of detections and the parallel channel laser array are mounted to a support structure that maintains alignment between the array of detectors and the plurality of laser sources with the reflector element.

* * * * *